(12) United States Patent
Yu et al.

(10) Patent No.: US 12,272,592 B2
(45) Date of Patent: Apr. 8, 2025

(54) HIGH VOLTAGE DEVICE AND MANUFACTURING METHOD THEREOF

(71) Applicant: Richtek Technology Corporation, Zhubei (TW)

(72) Inventors: Kun-Huang Yu, Hsinchu (TW);
Chien-Yu Chen, Kaohsiung (TW);
Ting-Wei Liao, Taichung (TW);
Chih-Wen Hsiung, Hsinchu (TW);
Chun-Lung Chang, Yilan (TW);
Kuo-Chin Chiu, Hsinchu (TW);
Wu-Te Weng, Hsinchu (TW);
Chien-Wei Chiu, Yunlin (TW);
Yong-Zhong Hu, Hsinchu (TW);
Ta-Yung Yang, Taoyuan (TW)

(73) Assignee: RICHTEK TECHNOLOGY CORPORATION, Zhubei (TW)

( * ) Notice: Subject to any disclaimer, the term of this patent is extended or adjusted under 35 U.S.C. 154(b) by 0 days.

(21) Appl. No.: 18/664,656

(22) Filed: May 15, 2024

(65) Prior Publication Data
US 2024/0297067 A1    Sep. 5, 2024

Related U.S. Application Data

(62) Division of application No. 17/547,829, filed on Dec. 10, 2021, now Pat. No. 12,062,570.
(Continued)

(30) Foreign Application Priority Data
Jun. 3, 2021  (TW) ................... 110120267

(51) Int. Cl.
*H01L 21/762*     (2006.01)
*H10D 30/65*      (2025.01)
(Continued)

(52) U.S. Cl.
CPC .... *H01L 21/7621* (2013.01); *H01L 21/76221* (2013.01); *H01L 21/76281* (2013.01);
(Continued)

(58) Field of Classification Search
CPC ........... H01L 29/0653; H01L 29/42368; H01L 29/7816; H01L 21/7621; H01L 21/76221;
(Continued)

(56) References Cited

U.S. PATENT DOCUMENTS 5,386,136 A * 1/1995 Williams ............ H01L 29/1079
257/104
6,215,152 B1 * 4/2001 Hebert .............. H01L 29/66659
257/329

(Continued)

*Primary Examiner* — Eugene Lee
(74) *Attorney, Agent, or Firm* — Tung @ Associates

(57) ABSTRACT

A high voltage device includes: a semiconductor layer, a well, a bulk region, a gate, a source, and a drain. The bulk region is formed in the semiconductor layer and contacts the well region along a channel direction. A portion of the bulk region is vertically below and in contact with the gate, to provide an inversion region of the high voltage device when the high voltage device is in conductive operation. A portion of the well lies between the bulk region and the drain, to separate the bulk region from the drain. A first concentration peak region of an impurities doping profile of the bulk region is vertically below and in contact with the source. A concentration of a second conductivity type impurities of the first concentration peak region is higher than that of other regions in the bulk region.

11 Claims, 10 Drawing Sheets

Related U.S. Application Data

(60) Provisional application No. 63/136,641, filed on Jan. 12, 2021.

(51) Int. Cl.
   *H10D 62/10*   (2025.01)
   *H10D 64/27*   (2025.01)

(52) U.S. Cl.
   CPC ........... *H10D 30/65* (2025.01); *H10D 62/116* (2025.01); *H10D 64/516* (2025.01)

(58) Field of Classification Search
   CPC ............. H01L 21/76281; H10D 30/65; H10D 62/116; H10D 64/516
   See application file for complete search history.

(56) References Cited

U.S. PATENT DOCUMENTS

| | | | | |
|---|---|---|---|---|
| 6,909,143 B2 * | 6/2005 | Jeon | ............... | H01L 29/0878 257/E29.066 |
| 7,265,416 B2 * | 9/2007 | Choi | ............... | H01L 29/7816 257/E29.066 |
| 7,282,765 B2 * | 10/2007 | Xu | ............... | H01L 29/41766 257/E29.066 |
| 7,589,389 B2 * | 9/2009 | Matsudai | ............... | H01L 29/063 257/493 |
| 7,851,314 B2 * | 12/2010 | Mallikarjunaswamy | ............... | H01L 21/26513 438/301 |
| 7,999,317 B2 * | 8/2011 | Lu | ............... | H01L 29/7824 257/493 |
| 8,686,498 B2 * | 4/2014 | Lee | ............... | H01L 29/1095 257/493 |
| 10,910,493 B2 * | 2/2021 | Ko | ............... | H01L 29/42356 |
| 2004/0238913 A1 * | 12/2004 | Kwon | ............... | H01L 29/42368 257/E29.066 |
| 2007/0057321 A1 * | 3/2007 | Kikuchi | ............... | H01L 29/0696 257/E29.066 |
| 2007/0114607 A1 * | 5/2007 | Pendharkar | ............... | H01L 29/1083 257/E29.063 |
| 2008/0042196 A1 * | 2/2008 | Anderson | ............... | H01L 29/66659 257/E29.054 |
| 2008/0246086 A1 * | 10/2008 | Korec | ............... | H01L 29/7816 257/E29.066 |
| 2010/0001343 A1 * | 1/2010 | Choi | ............... | H01L 29/66681 438/286 |
| 2010/0013012 A1 * | 1/2010 | Cai | ............... | H01L 29/0847 438/286 |
| 2010/0025763 A1 * | 2/2010 | Paul | ............... | H01L 29/408 257/349 |
| 2011/0127602 A1 * | 6/2011 | Mallikarjunaswamy | ............... | H01L 27/0617 257/E29.256 |
| 2013/0344671 A1 * | 12/2013 | Kim | ............... | H01L 29/66681 438/286 |
| 2019/0245034 A1 * | 8/2019 | Korec | ............... | H01L 21/8249 |

* cited by examiner

HIGH VOLTAGE DEVICE AND MANUFACTURING METHOD THEREOF

CROSS REFERENCE

The present invention claims priority to U.S. 63/136,641 filed on Jan. 12, 2021 and claims priority to TW 110120267 filed on Jun. 3, 2021.

BACKGROUND OF THE INVENTION

Field of Invention

The present invention relates to a high voltage device and a manufacturing method thereof; particularly, it relates to such high voltage device capable of inhibiting a parasitic transistor from being turned ON.

Description of Related Art

Please refer to FIGS. 1A and 1B, which show a top view and a cross-section view of a conventional high voltage device 100, respectively. In the context of the present invention, a "high voltage" device refers to a device which needs to withstand a voltage over 3.3V on a drain thereof in normal operation. Typically, the high voltage device 100 has a drift region 12a (as indicated by the dashed frame shown in FIG. 1B) which separates the drain 19 and the body region 15 of the high voltage device 100, wherein a lateral length of the drift region 12a is determined according to the threshold voltage that the high voltage device 100 is designed to operate by. As shown in FIGS. 1A and 1B, the high voltage device 100 includes: a well 12, a drift oxide region 14, a body region 15, a body contact 16, a gate 17, a source 18, and a drain 19. The well 12 has a conductivity type of N-type, and is formed on a substrate 11. The gate 17 overlays a part of the drift oxidation region 14. The body region 15 and the body contact 16 have a conductivity type of P-type. The source 18 and the drain 19 have a conductivity type of N-type.

Typically, in a manufacturing method of the high voltage device 100, the high voltage device 100 is formed by plural units in a mirror arrangement fashion wherein two symmetrical devices share the body region 15 and the body contact 16. As shown in FIGS. 1A and 1B, a source 18' is mirror symmetrical to the source 18, a gate 17' is mirror symmetrical to the gate 17, and so on.

The prior art shown in FIG. 1 has the following drawback. When the high voltage device 100 operates, electron holes in the hot carriers generated due to a high electrical field will be injected into the body contact 16 through the body region 15. When such hot carriers generate a current that flows through the body region 15, a voltage drop within the body region 15 will be increased, causing a parasitic NPN bipolar junction transistor (BJT) formed by the source 18, the body region 15 and the well 12 to be turned ON, whereby a high ON current will be generated to damage the high voltage device 100. In other words, the safe operation area (SOA) of the high voltage device 100. The definition of SOA is well known by those skilled in the art, so it is not redundantly explained here.

In view of above, to overcome the drawback in the prior art, the present invention provides a high voltage device which can inhibit a parasitic transistor from being turned ON when the high voltage device operates, so as to increase an SOA of the high voltage device, and a manufacturing method thereof.

SUMMARY OF THE INVENTION

From one perspective, the present invention provides a high voltage device, comprising: a semiconductor layer, which is formed on a substrate; a well, which has a first conductivity type, and is formed in the semiconductor layer; a bulk region, which has a second conductivity type, and is formed in the semiconductor layer, wherein the bulk region is in contact with the well along a channel direction; a gate, which is formed on the semiconductor layer, wherein a portion of the bulk region is vertically below and in contact with the gate, to provide an inversion region of the high voltage device when the high voltage device is in an ON operation; and a source having the first conductivity type and a drain having the first conductivity type, wherein the source and the drain are formed below and in contact with a top surface of the semiconductor layer, wherein the source and the drain are at two different sides of the gate, respectively, wherein the source is in the bulk region, whereas, the drain is in a part of the well which is away from the bulk region, wherein a portion of the well lies between the bulk region and the drain, to separate the bulk region from the drain; wherein a first concentration peak region of the bulk region is vertically below and in contact with the source; wherein a concentration of the second conductivity type impurities of the first concentration peak region is higher than that of other regions in the bulk region.

In one embodiment, a second concentration peak region of the bulk region is vertically below and in contact with the top surface of the semiconductor layer, wherein the second concentration peak region encompasses and is in contact with the source, and wherein the concentration of the second conductivity type impurities of the second concentration peak region is higher than that of other regions excluding the first concentration peak region in the bulk region.

In one embodiment, the bulk region further includes: a first layer, which is formed via a first process step, wherein at the same time, the first process step forms another first layer in another device in the semiconductor layer, and wherein a depth of the first layer extending downward from the top surface is greater than that of the source.

In one embodiment, the bulk region further includes: a second layer, which is formed via a second process step, wherein at the same time, the second process step forms another second layer in another device in the semiconductor layer, and wherein a depth of the second layer extending downward from the top surface is greater than that of the first layer.

In one embodiment, the high voltage device further comprises: a buried layer, wherein at least a portion of the buried layer is formed in the semiconductor layer, wherein the buried layer has the first conductivity type, and wherein the buried layer is vertically below the bulk region and the well.

In one embodiment, the high voltage device further comprises: a drift oxide region, which is formed on the semiconductor layer, wherein the gate is vertically above and in contact with the drift oxide region.

In one embodiment, the drift oxide region includes a local oxidation of silicon (LOCOS) structure, a shallow trench isolation (STI) structure, or a chemical vapor deposition (CVD) oxide structure.

In one embodiment, a depth of the source extending downward from the top surface is greater than that of the second concentration peak region.

From another perspective, the present invention provides a manufacturing method of a high voltage device, comprising: forming a semiconductor layer on a substrate; forming a well in the semiconductor layer, wherein the well has a first conductivity type; forming a bulk region in the semiconductor layer, wherein the bulk region has a second conductivity type, wherein the bulk region is in contact with the well along a channel direction; forming a gate on the semiconductor layer, wherein a portion of the bulk region is vertically below and in contact with the gate, to provide an inversion region of the high voltage device when the high voltage device is in an ON operation; and forming a source and a drain below a top surface of the semiconductor layer and causing the source and the drain to be in contact with the top surface of the semiconductor layer, wherein both the source and the drain have the first conductivity type, wherein the source and the drain are at two different sides of the gate, respectively, wherein the source is in the bulk region, whereas, the drain is in a part of the well which is away from the bulk region, wherein a portion of the well lies between the bulk region and the drain, to separate the bulk region from the drain; wherein a first concentration peak region of the bulk region is vertically below and in contact with the source; wherein a concentration of a second conductivity type impurities of the first concentration peak region is higher than that of other regions in the bulk region.

In one embodiment, a second concentration peak region of the bulk region is vertically below and in contact with the top surface of the semiconductor layer, wherein the second concentration peak region encompasses and is in contact with the source, and wherein the concentration of the second conductivity type impurities of the second concentration peak region is higher than that of other regions excluding the first concentration peak region in the bulk region.

In one embodiment, the bulk region further includes: a first layer, which is formed via a first process step, wherein at the same time, the first process step forms another first layer in another device in the semiconductor layer, and wherein a depth of the first layer extending downward from the top surface is greater than that of the source.

In one embodiment, the bulk region further includes: a second layer, which is formed via a second process step, wherein at the same time, the second process step forms another second layer in another device in the semiconductor layer, and wherein a depth of the second layer extending downward from the top surface is greater than that of the first layer.

In one embodiment, the manufacturing method of the high voltage device further comprises: forming a buried layer; wherein at least a portion of the buried layer is formed in the semiconductor layer, wherein the buried layer has the first conductivity type, and wherein the buried layer is vertically below the bulk region and the well.

In one embodiment, the manufacturing method of the high voltage device further comprises: forming a drift oxide region on the semiconductor layer, wherein the gate is vertically above and in contact with the drift oxide region.

In one embodiment, the drift oxide region includes a local oxidation of silicon (LOCOS) structure, a shallow trench isolation (STI) structure, or a chemical vapor deposition (CVD) oxide structure.

In one embodiment, a depth of the source extending downward from the top surface is greater than that of the second concentration peak region.

In one embodiment, the semiconductor layer is a P-type epitaxial silicon layer with a resistance 45 Ohm-cm.

In one embodiment, the drift oxide region includes a CVD oxide region with a thickness of 400 Å-450 Å.

In one embodiment, the high voltage device is a laterally diffused metal oxide semiconductor (LDMOS) device with a gate driving voltage of 3.3V and a gate oxide thickness of 80 Å-100 Å.

In one embodiment, a low voltage device is formed on the substrate, and the low voltage device has a channel length of 0.18 μm.

In one embodiment, the first concentration peak region is formed by a self-aligned process step, wherein the self-aligned process step includes: etching a poly silicon layer to form a conductive layer of the gate; and using the conductive layer as a mask and forming the first concentration peak region by an ion implantation step.

The present invention is advantageous in that: the present invention can prevent a parasitic bipolar junction transistor (BJT) from being ON, thus inhibiting the parasitic BJT from functioning.

The objectives, technical details, features, and effects of the present invention will be better understood with regard to the detailed description of the embodiments below, with reference to the attached drawings.

DESCRIPTION OF THE PREFERRED EMBODIMENTS

The drawings as referred to throughout the description of the present invention are for illustration only, to show the interrelations among the process steps and the layers, but the shapes, thicknesses, and widths are not drawn in actual scale.

Figure 1A:
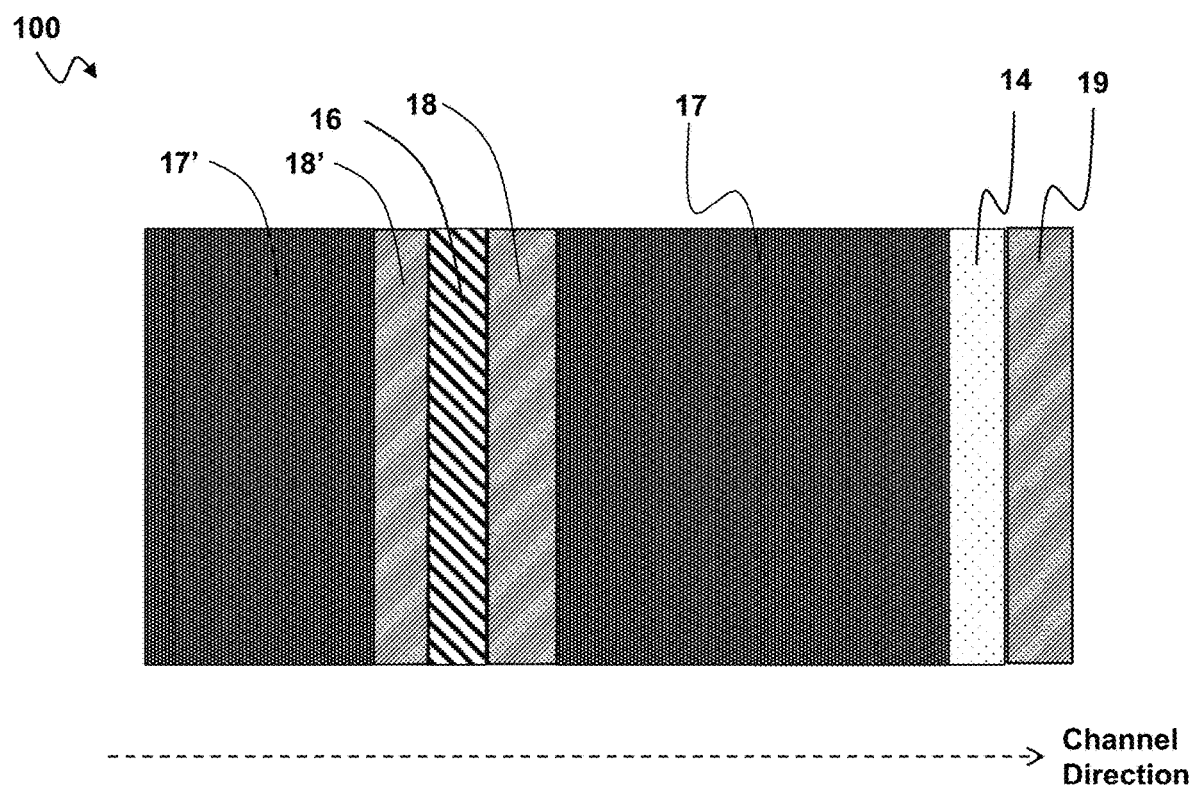
FIGS. 1A and 1B show a top view and a cross-section view of a conventional high voltage device, respectively.
Figure 1B:
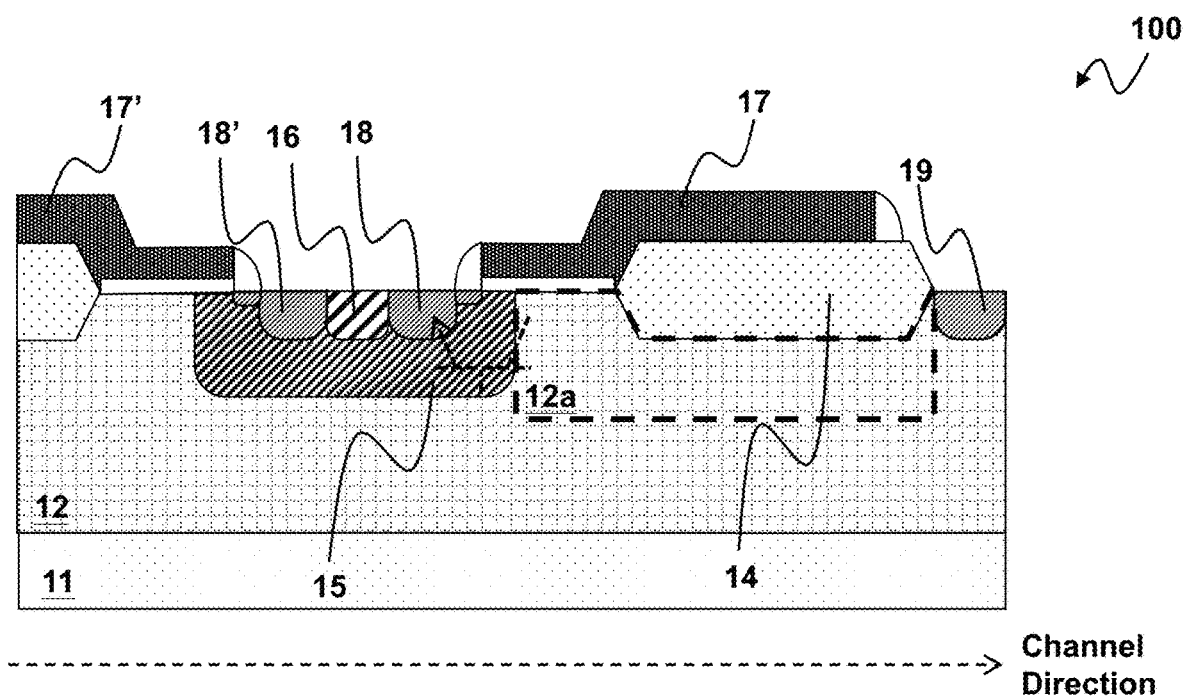
Figure 2:
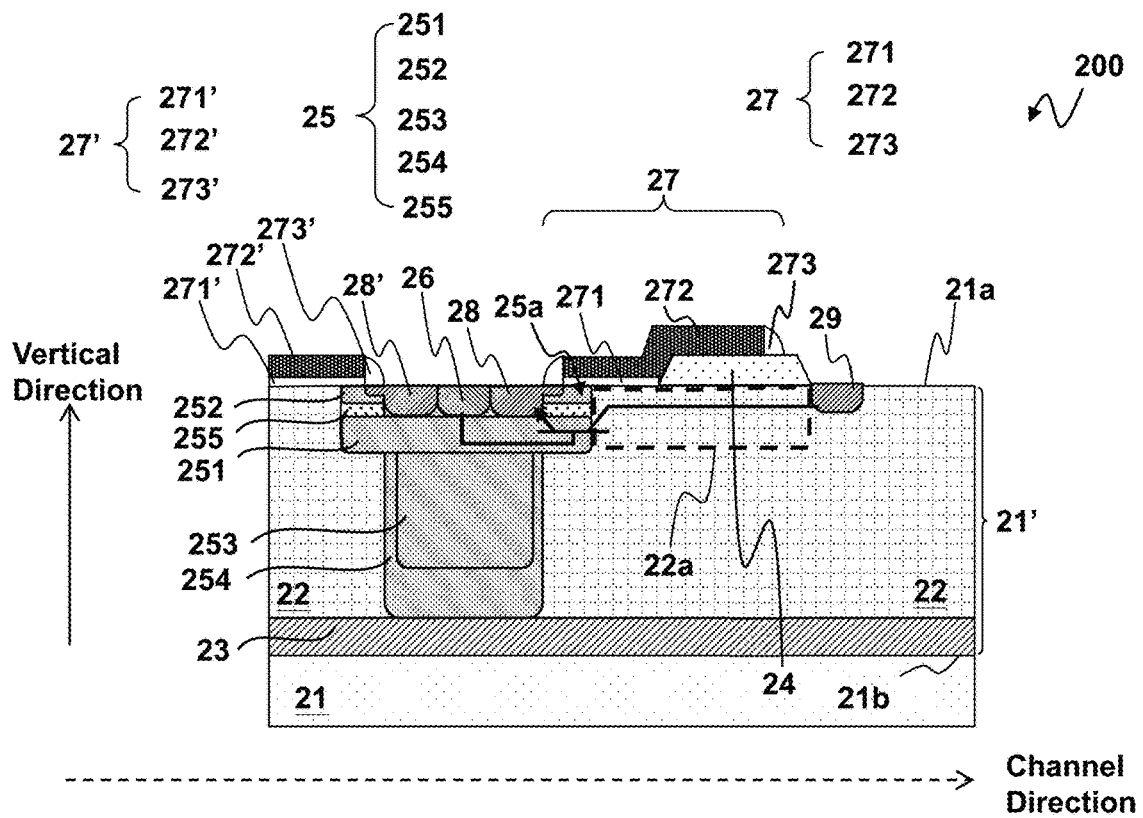
FIG. 2 shows a cross-section view of a high voltage device according to an embodiment of the present invention.

Please refer to FIG. 2, which shows a cross-section view of a high voltage device 200 according to an embodiment of the present invention. The high voltage device 200 comprises: a substrate 21, a semiconductor layer 21', a well 22, a drift oxide region 24, a bulk region 25, a bulk contact 26, a gate 27, a source 28, a drain 29, a first concentration peak region 251, a second concentration peak region 252, a first layer 253, a second layer 254, a third layer 255 and a buried layer 23. The first concentration peak region 251, the second concentration peak region 252, the first layer 253, the second layer 254 and the third layer 255 constitute the bulk region 25. In a manufacturing method of the high voltage device 200, plural units of the high voltage devices 200 are formed in a mirror arrangement fashion wherein the bulk region 25 and the bulk contact 26 are shared by neighboring high voltage devices 200. Therefore as shown in FIG. 2, a source 28' is mirror symmetrical to the source 28; a gate 27' is mirror symmetrical to the gate 27; and so on. In one preferable embodiment, the high voltage device 200 is a laterally diffused metal oxide semiconductor (LDMOS)

device as shown in FIG. 2, with a gate driving voltage of 3.3V and a gate oxide thickness of 80 Å-100 Å.

The semiconductor layer 21' is formed on the substrate 21. The semiconductor layer 21' has a top surface 21a and a bottom surface 21b opposite to the top surface 21a in a vertical direction (as indicated by the direction of the solid arrow in FIG. 2). The substrate 21 is, for example but not limited to, a P-type or N-type semiconductor silicon substrate. The semiconductor layer 21', for example, is formed on the substrate 21 by an epitaxial process step, or is a part of the substrate 21. The semiconductor layer 21' can be formed by various methods known to a person having ordinary skill in the art, so the details thereof are not redundantly explained here. In one preferable embodiment, the semiconductor layer 21' is a P-type epitaxial silicon layer with a resistance 45 Ohm-cm.

Please still refer to FIG. 2. The drift oxide region 24 is formed on and in contact with the top surface 21a and is located on and in contact with part of a drift region 22a (as indicated by the dashed line frame shown in FIG. 2). The drift oxide region 24 is for example but not limited to a chemical vapor deposition (CVD) structure as shown in the figure, or may be a shallow trench isolation (STI) structure or a local oxidation of silicon (LOCOS) structure in other embodiments. The LOCOS structure, the STI structure or the CVD structure can be formed by a corresponding method known to a person having ordinary skill in the art, so the details thereof are not redundantly explained here. In one preferable embodiment, the drift oxide region 24 includes the CVD oxide region with a thickness of 400 Å-450 Å.

The well 22 has a first conductivity type, and is formed in the semiconductor layer 21'. The well 22 is below and in contact with the top surface 21a in a vertical direction. The bulk region 25 has a second conductivity type, and is formed in the semiconductor layer 21'. The bulk region 25 is below and in contact with the top surface 21a in the vertical direction. The bulk contact 26 has the second conductivity type, and is formed in the bulk region 25, to serve as an electrical contact of the bulk region 25. The bulk contact 26 is below and in contact with the top surface 21a in the vertical direction. The bulk region 25 is formed in the semiconductor layer 21', and is in contact with the well 22 in a channel direction (as shown by a dashed arrow in FIG. 2). The gate 27 is formed on the top surface 21a of the semiconductor layer 21'. In the vertical direction, a portion of the bulk region 25 is vertically below and in contact with the gate 27, to provide an inversion current channel 25a (also referred to as an inversion region) of the high voltage device 200 when the high voltage device 200 is in a conductive operation (also referred to as "ON operation").

Please still refer to FIG. 2. The source 28 has the first conductivity type and the drain 29 has the first conductivity type. In the vertical direction, the source 28 and the drain 29 are formed below and in contact with the top surface 21a of the semiconductor layer 21'. The source 28 and the drain 29 are at two different sides of the gate 27, respectively, wherein the source 28 is in the bulk region 25 and is below and outside one side of the gate 27 in the channel direction. The drain 29 is in a part of the well 22 which is away from the bulk region 25 and is below and outside another side of the gate 27 in the channel direction. A portion of the well 22 lies between the bulk region 25 and the drain 29, to separate the bulk region 25 from the drain 29. A drift region 22a is formed in the well 22 and is near to the top surface 21a. The drift region 22a lies between the drain 29 and the bulk region 25 in the channel direction, to serve as a drift current channel in the ON operation of the high voltage device 200. In one embodiment, the sources 28 and 28' are electrically connected to the bulk contact 26 via a metal silicide layer (not shown).

Please still refer to FIG. 2. As described above, the bulk region 25 includes: the first concentration peak region 251, the second concentration peak region 252, the first layer 253, the second layer 254 and the third layer 255. The first concentration peak region 251 of the bulk region 25 is vertically below and in contact with the source 28 and the source 28'. In one embodiment, the concentration of the second conductivity type impurities of the first concentration peak region 251 is higher than that of other regions in the bulk region 25. A second concentration peak region 252 of the bulk region 25 is below and in contact with the top surface 21a of the semiconductor layer 21', and is in a top portion of the bulk region 25. The second concentration peak region 252 encompasses and is in contact with the source 28 and the source 28'. In one embodiment, the concentration of the second conductivity type impurities of the second concentration peak region 252 is higher than that of other regions in addition to the first concentration peak region 251 in the bulk region 25. In one embodiment, a depth of the source 28 extending downward from the top surface 21a is greater than a depth of the second concentration peak region 252 extending downward from the top surface 21a.

The first layer 253 is below and in contact with the top surface 21a of the semiconductor layer 21'. The first layer 253 is formed via a first process step, while in the meantime, the first process step forms another first layer in another device in the semiconductor layer 21'. That is, through executing a same lithography process step and a same ion implantation process step, this embodiment can form the first layer 253 in the high voltage device 200 and another device at the same time, which does not require extra manufacturing cost. In one embodiment, a depth of the first layer 253 extending downward from the top surface 21a is greater than a depth of the source 28 extending downward from the top surface 21a.

As shown in FIG. 2, the second layer 254 is below and in contact with the top surface 21a of the semiconductor layer 21'. The second layer 254 is formed via a second process step, while in the meantime, the second process step forms another second layer in another device in the semiconductor layer 21'. That is, by executing a same lithography process step and a same ion implantation process step, this embodiment can form the second layer 254 in the high voltage device 200 and another second layer in another device at the same time, without extra manufacturing cost. In one embodiment, a depth of the second layer 254 extending downward from the top surface 21a is greater than a depth of the first layer 253 extending downward from the top surface 21a.

In one embodiment, the bulk region 25 is constituted by the first concentration peak region 251, the second concentration peak region 252, the first layer 253, the second layer 254 and the third layer 255. The buried layer 23 is formed in the semiconductor layer 21', and has the first conductivity type. The buried layer 23 is vertically below the second layer 254 of the bulk region 25 and the well 22.

In one preferable embodiment, the first concentration peak region 251 is formed by a self-aligned process step, wherein the self-aligned process step includes: etching a poly silicon layer to form a conductive layer 272 of the gate 27; and using the conductive layer 272 as mask a and forming the first concentration peak region 251 by an ion implantation step.

In one preferable embodiment, a low voltage device is formed on the substrate 21, and the low voltage device has a channel length of 0.18 µm.

One technical feature of the present invention which is advantageous over the prior art is that, as compared to the prior art, the first concentration peak region 251 and the second concentration peak region 252 in the present invention possess a higher concentration of the second conductivity type impurities; as a result, when the high voltage device 200 of the present invention operates, electron holes in the hot carriers generated due to a high electrical field will be injected into the bulk contact 26 from the bulk region 25. When such hot carriers generate a current that flows through the bulk region 25, because such current flows through the first concentration peak region 251 (and the second concentration peak region 252) having a higher concentration of the second conductivity type impurities, a voltage drop within the bulk region 25 of the present invention is relatively lower than in the prior art, whereby a parasitic BJT transistor will not be turned ON (due to insufficient base voltage), that is, the present invention inhibits the parasitic BJT transistor from being turned ON. The parasitic bipolar junction transistor (BJT) is formed by a portion of the well 22, a portion of the bulk region 25, a portion of the source 28 and a portion of the bulk contact 26, as shown by a solid line symbol indicative of an NPN BJT in FIG. 2.

Note that the term "inversion current channel" 25a means thus. Taking this embodiment as an example, when the high voltage device 200 operates in the ON operation due to the voltage applied to the gate 27, an inversion layer is formed beneath the gate 27, between the source 28 and the drift current channel, so that a conduction current flows through the region of the inversion layer, which is known to a person having ordinary skill in the art.

Note that the term "drift current channel" means thus. Taking this embodiment as an example, the drift region provides a region where the conduction current passes through in a drifting manner when the semiconductor device 200 operates in the ON operation, and the current path through the drift region is referred to as the "drift current channel", which is known to a person having ordinary skill in the art, so the details thereof are not redundantly explained here.

Note that the top surface 21a as referred to does not mean a completely flat plane but refers to the surface of the semiconductor layer 21'. In the present embodiment, for example, a part of the top surface 21a where the drift oxide region 24 is in contact with has a recessed portion.

Note that the gate 27 as defined in the context of this invention includes a dielectric layer 271 in contact with the top surface 21a, a conductive layer 272 which is conductive, and a spacer layer 273 which is electrically insulative, which is known to a person having ordinary skill in the art.

Note that the above-mentioned "first conductivity type" and "second conductivity type" mean that impurities of corresponding conductivity types are doped in regions of the high voltage device (for example but not limited to the aforementioned well, body region, source and drain, etc.), so that the regions have the corresponding conductivity types. The conductivity type of the first conductivity type is opposite to the conductivity type of the second conductivity type. For example, the first conductivity type is N-type and the second conductivity type is P-type, or the first conductivity type is P-type and the second conductivity type is N-type.

In addition, the term "high voltage" device means that, when the device operates in normal operation, the voltage applied to the drain is higher than a specific voltage, such as 3.3V or 50V; for devices of different high voltages, a lateral distance (distance of the drift region 22a) between the bulk region 25 and the drain 29 can be determined according to the operation voltage that the device is designed to withstand during normal operation, which is known to a person having ordinary skill in the art.

Note that the term "low voltage" device means that, when the device operates in normal operation, the voltage applied to the drain is lower than a specific voltage, such as 3.3V.

One technical feature of the present invention which is advantageous over the prior art is that, according to the present invention, taking the embodiment shown in FIG. 2 as an example, when the high voltage device 200 operates, the hot carriers (for example but not limited to the electron holes in an N-type high voltage device) generated due to a high electrical field will be absorbed via a "hot carriers absorption channel" which is a path of injecting the hot carriers into the bulk contact 26 from the bulk region 25. As compared to the prior art, because the first concentration peak region 251 of the present invention is more closer to the PN junction formed by the bulk region 25 and the well 22 and because the concentration of the second conductivity type impurities of the first concentration peak region 251 is higher than that of other regions in the bulk region 25, the resistance of the "hot carriers absorption channel" of the present invention is relatively lower than the prior art. As a consequence, when the hot carriers flow through the "hot carriers absorption channel", the voltage drop within the bulk region 25 of the present invention is relatively lower, so that the base voltage of a parasitic BJT transistor formed by the bulk region 25, the source 28 and the well 22 is insufficient to turn ON the parasitic BJT transistor. That is, the present invention provides a high voltage device which can inhibit its parasitic BJT transistor from being turned ON when the high voltage device operates.

Figure 3:
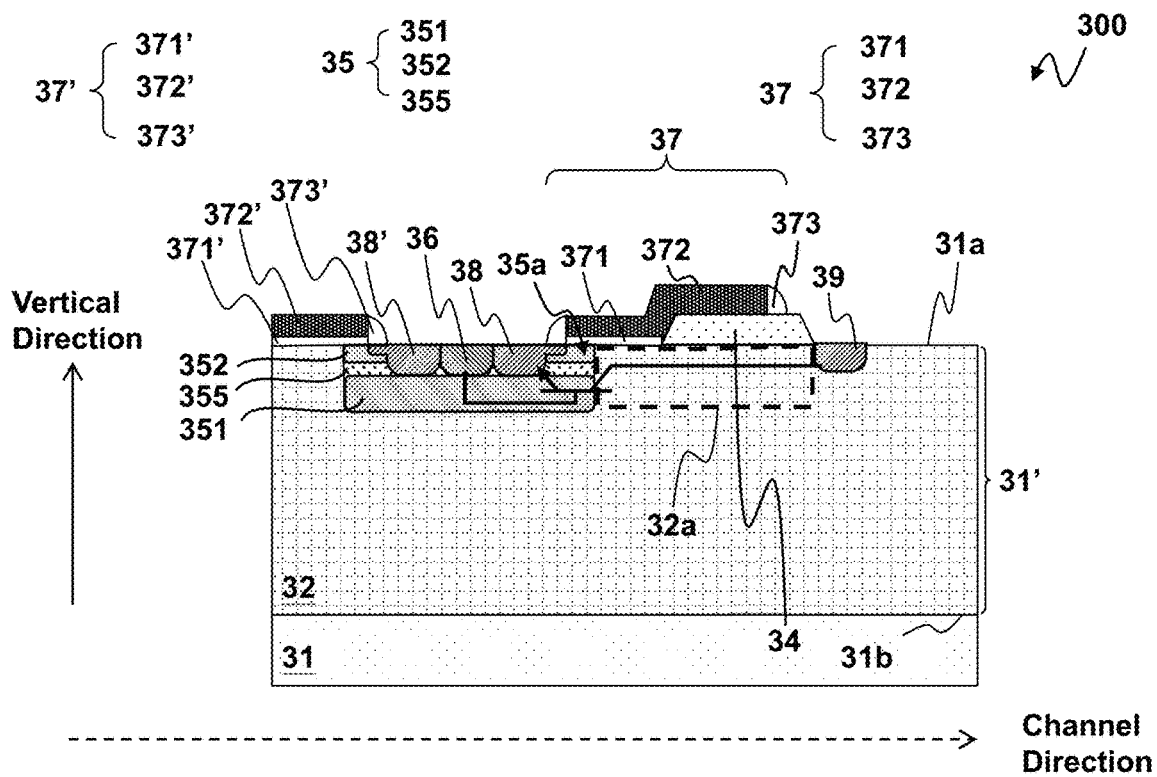
FIG. 3 shows a cross-section view of a high voltage device according to another embodiment of the present invention.

Please refer to FIG. 3, which shows a cross-section view of a high voltage device 300 according to another embodiment of the present invention. This embodiment shown in FIG. 3 is different from the embodiment shown in FIG. 2 in that: the high voltage device 300 of this embodiment does not include a first layer and a second layer. In addition, because there is no first layer and second layer in the high voltage device 300, the buried layer can also be omitted from the high voltage device 300. A substrate 31, a semiconductor layer 31', a well 32, a drift oxide region 34, gates 37 and 37', sources 38 and 38', a drain 39, a first concentration peak region 351, a second concentration peak region 352 of this embodiment shown in FIG. 3 are the same as the semiconductor layer 21', the well 22, the drift oxide region 24, gates 27 and 27', sources 28 and 28', the drain 29, the first concentration peak region 251, the second concentration peak region 252 of the embodiment shown in FIG. 2, respectively, so the details thereof are not redundantly repeated here.

In this embodiment, a body region 35 serves as a bulk region, to provide an inversion current channel 35a. A body contact 36 serves as an electrical contact of the body region 35. That is, the body contact 36 serves as a bulk contact.

Figure 4A:
FIGS. 4A to 4K show a manufacturing method of a high voltage device according to an embodiment of the present invention.

Please refer to FIGS. 4A to 4K, which show a manufacturing method of a high voltage device 200 according to an embodiment of the present invention. As shown in FIG. 4A, a substrate 21 is provided. The substrate 21 is, for example but not limited to, a P-type or N-type semiconductor silicon substrate. In one preferable embodiment, the high voltage device 200 is a laterally diffused metal oxide semiconductor (LDMOS) device with a gate driving voltage of 3.3V and a gate oxide thickness of 80 Å-100 Å.

Figure 4B:
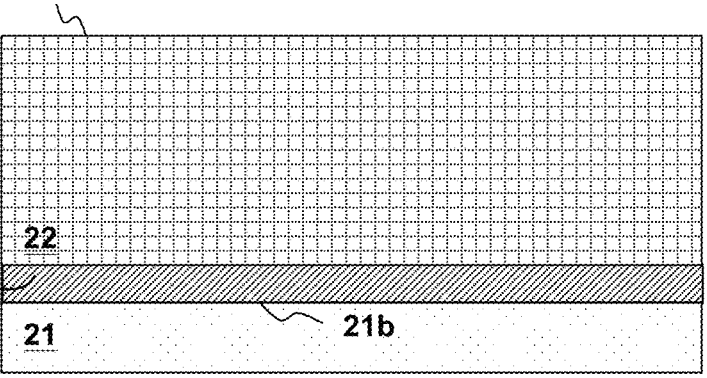

Next, referring to FIG. 4B, a buried layer 23 is formed below a well 22 (the well 22 is to be formed later). In the vertical direction, the buried layer 23 is formed for example at two sides of a junction between the substrate 21 and a semiconductor layer 21'. That is, a portion of the buried layer 23 is formed in the substrate 21, whereas, another portion of the buried layer 23 is formed in the semiconductor layer 21'. The buried layer 23 has the first conductivity type. The buried layer 23 can be formed by, for example but not limited to, an ion implantation process step, wherein the ion implantation process implants first conductivity type impurities in the substrate 21 in the form of accelerated ions, to form the buried layer 23 via thermal diffusion subsequent to the formation of the semiconductor layer 21'. The semiconductor layer 21' is formed on the substrate 21, wherein the semiconductor layer 21' has the top surface 21a and the bottom surface 21b opposite to the top surface 21a in the vertical direction (as indicated by the direction of a solid arrow shown in FIG. 4B). The semiconductor layer 21', for example, is formed on the substrate 21 by an epitaxial process step, or is a part of the substrate 21. The semiconductor layer 21' can be formed by various methods known to a person having ordinary skill in the art, so the details thereof are not redundantly explained here. In one preferable embodiment, the semiconductor layer 21' is a P-type epitaxial silicon layer with a resistance of 45 Ohm-cm.

Next, the well 22 is formed in the semiconductor layer 21'. The well 22 is below and in contact with the top surface 21a in the vertical direction. The well 22 has a first conductivity type. The well 22 can be formed by, for example but not limited to, an ion implantation process step which implants first conductivity type impurities in the semiconductor layer 21' in the form of accelerated ions as indicated by dashed arrows shown in FIG. 4B, to form the well 22.

Figure 4C:
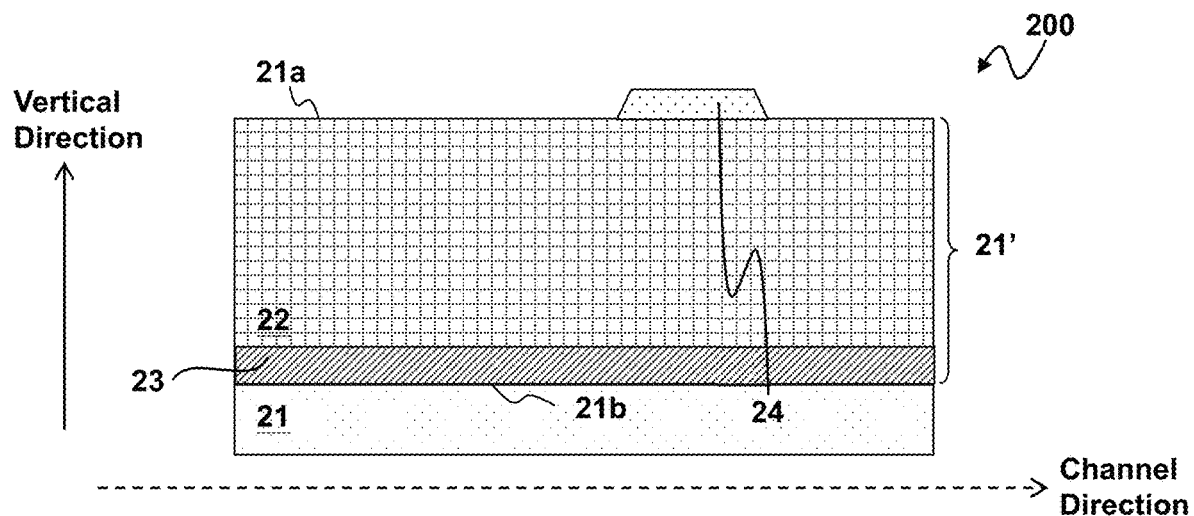

Next, referring to FIG. 4C, the drift oxide region 24 is formed on and in contact with the top surface 21a. The drift oxide region 24 is electrically insulative. The drift oxide region 24 is for example but not limited to a chemical vapor deposition (CVD) structure as shown in the figure, or may be a shallow trench isolation (STI) structure or a local oxidation of silicon (LOCOS) structure in other embodiments. The drift oxide region 24 is on and in contact with a drift region 22a (referring to FIG. 4F and FIG. 2). In one preferable embodiment, the drift oxide region 24 includes the CVD oxide region with a thickness of 400 Å-450 Å.

Figure 4D:
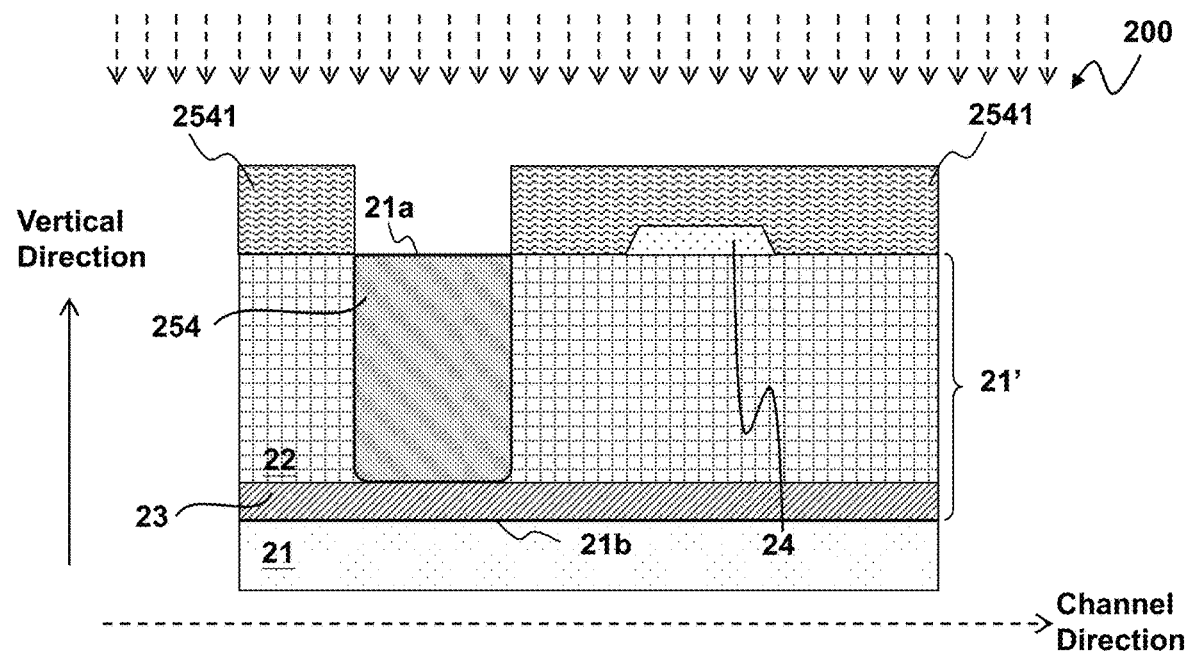

Next, the bulk region 25 is formed in the semiconductor layer 21'. In one embodiment, forming the bulk region 25 includes: forming the second layer 254, forming the first layer 253, forming the third layer 255, forming the first concentration peak region 251 and forming the second concentration peak region 252. In another embodiment, forming the bulk region 25 includes: forming the third layer 255, forming the first concentration peak region 251 and forming the second concentration peak region 252. Referring to FIG. 4D, the second layer 254 is formed in the well 22. The second layer 254 is below and in contact with the top surface 21a in the vertical direction. The second layer 254 has the second conductivity type. The second layer 254 can be formed by, for example but not limited to, a lithography process step and an ion implantation process step, wherein the lithography process step includes: forming a photo-resist layer 2541 as a mask, and doping second conductivity type impurities in the well 22, to form the second layer 254. And, the ion implantation process step implants second conductivity type impurities in the well 22 in the form of accelerated ions as indicated by dashed arrows shown in FIG. 4D, to form the second layer 254. The above-mentioned process steps for forming the second layer 254 can form another second layer in another device in the semiconductor layer 21' at the same time.

Figure 4E:
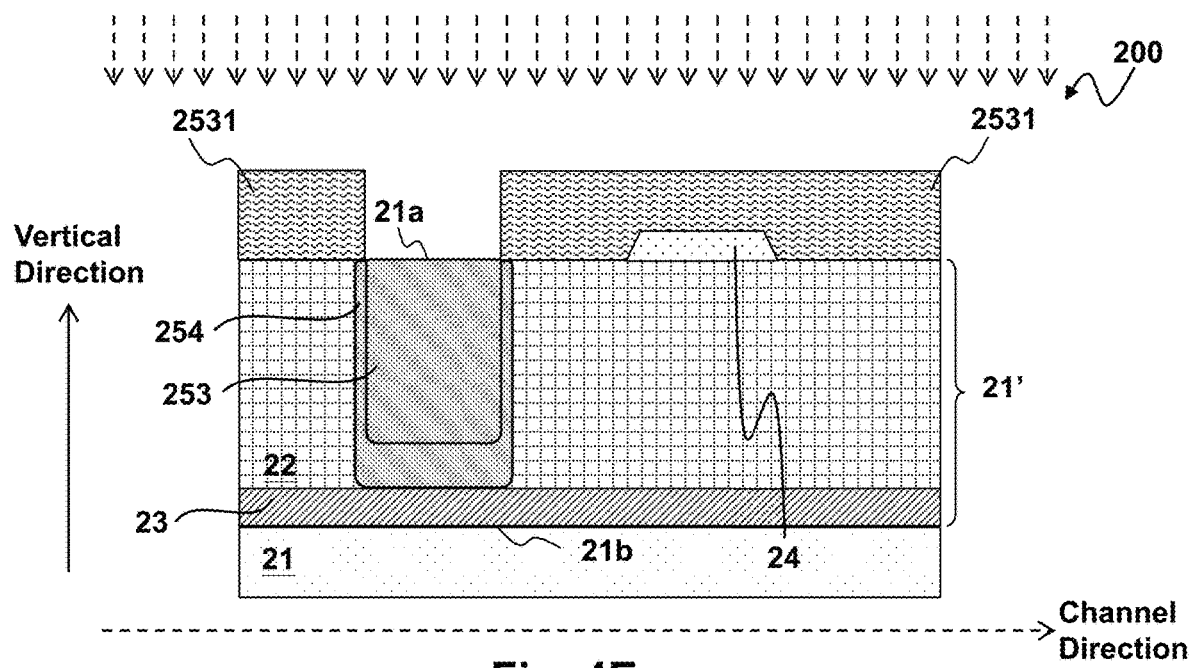

Next, referring to FIG. 4E, the first layer 253 is formed in the second layer 254. The first layer 253 is below and in contact with the top surface 21a in the vertical direction. The first layer 253 has the second conductivity type. The first layer 253 can be formed by, for example but not limited to, a lithography process step and an ion implantation process step, wherein the lithography process step includes: forming a photo-resist layer 2531 as a mask, and doping second conductivity type impurities in the second layer 254, to form the first layer 253. And, the ion implantation process step implants second conductivity type impurities in the second layer 254 in the form of accelerated ions as indicated by dashed arrows shown in FIG. 4E, to form the first layer 253. The above-mentioned process steps for forming the first layer 253 can form another first layer in another device in the semiconductor layer 21' at the same time. In one embodiment, a depth of the first layer 253 extending downward from the top surface 21a is greater than a depth of the source 28 extending downward from the top surface 21a. In one embodiment, a depth of the second layer 254 extending downward from the top surface 21a is greater than a depth of the first layer 253 extending downward from the top surface 21a.

Figure 4F:
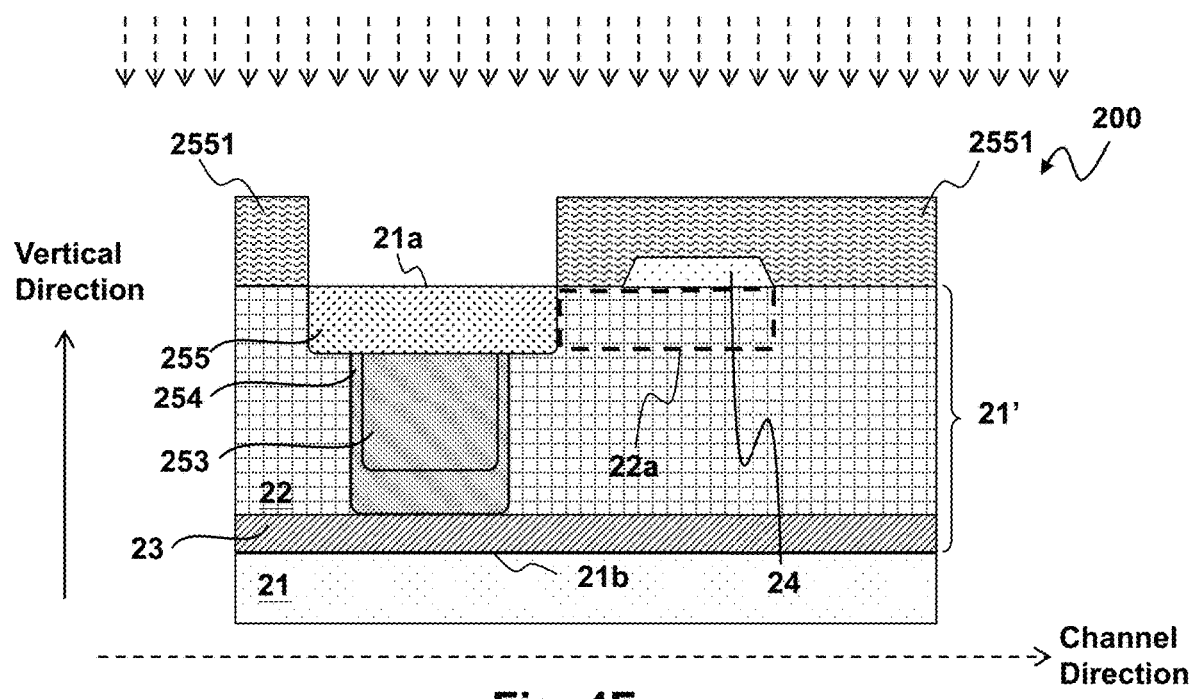

Next, referring to FIG. 4F, the third layer 255 is formed in the well 22. The third layer 255 is below and in contact with the top surface 21a in the vertical direction. The third layer 255 has the second conductivity type. The third layer 255 can be formed by, for example but not limited to, a lithography process step and an ion implantation process step, wherein the lithography process step includes: forming a photo-resist layer 2551 as a mask, and doping second conductivity type impurities in the well 22, to form the third layer 255. And, the ion implantation process step implants second conductivity type impurities in the well 22 in the form of accelerated ions as indicated by dashed arrows shown in FIG. 4F, to form the third layer 255.

Figure 4G:
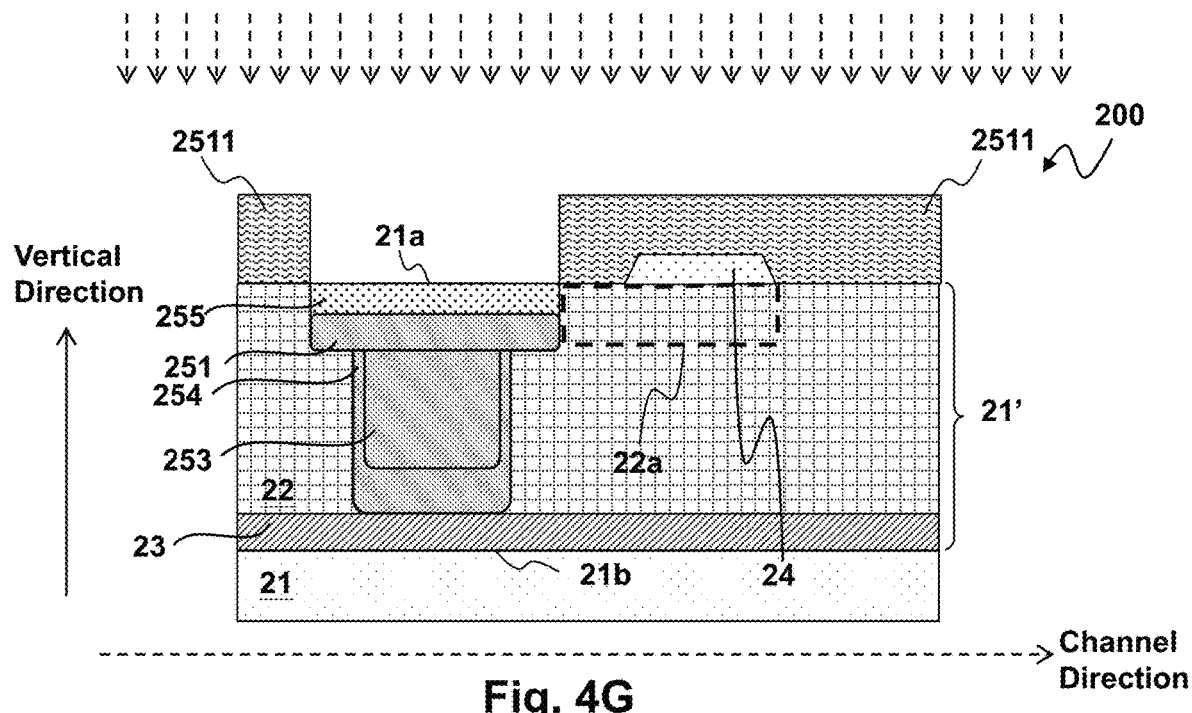

Next, referring to FIG. 4G, the first concentration peak region 251 is formed in the third layer 255. The first concentration peak region 251 is in a bottom portion of the third layer 255, and is vertically below and in contact with the source 28 and the source 28' (referring to FIG. 2 and FIG. 4I). The first concentration peak region 251 has the second conductivity type. The first concentration peak region 251 can be formed by, for example but not limited to, a lithography process step and an ion implantation process step, wherein the lithography process step includes: forming a photo-resist layer 2511 as a mask, and doping second conductivity type impurities in the third layer 255, to form the first concentration peak region 251. And, the ion implantation process step implants second conductivity type impurities in the third layer 255 in the form of accelerated ions as indicated by dashed arrows shown in FIG. 4G, to form the first concentration peak region 251. In one embodiment, a concentration of the second conductivity type impurities of the first concentration peak region 251 is higher than that of other regions in the bulk region 25.

Figure 4H:
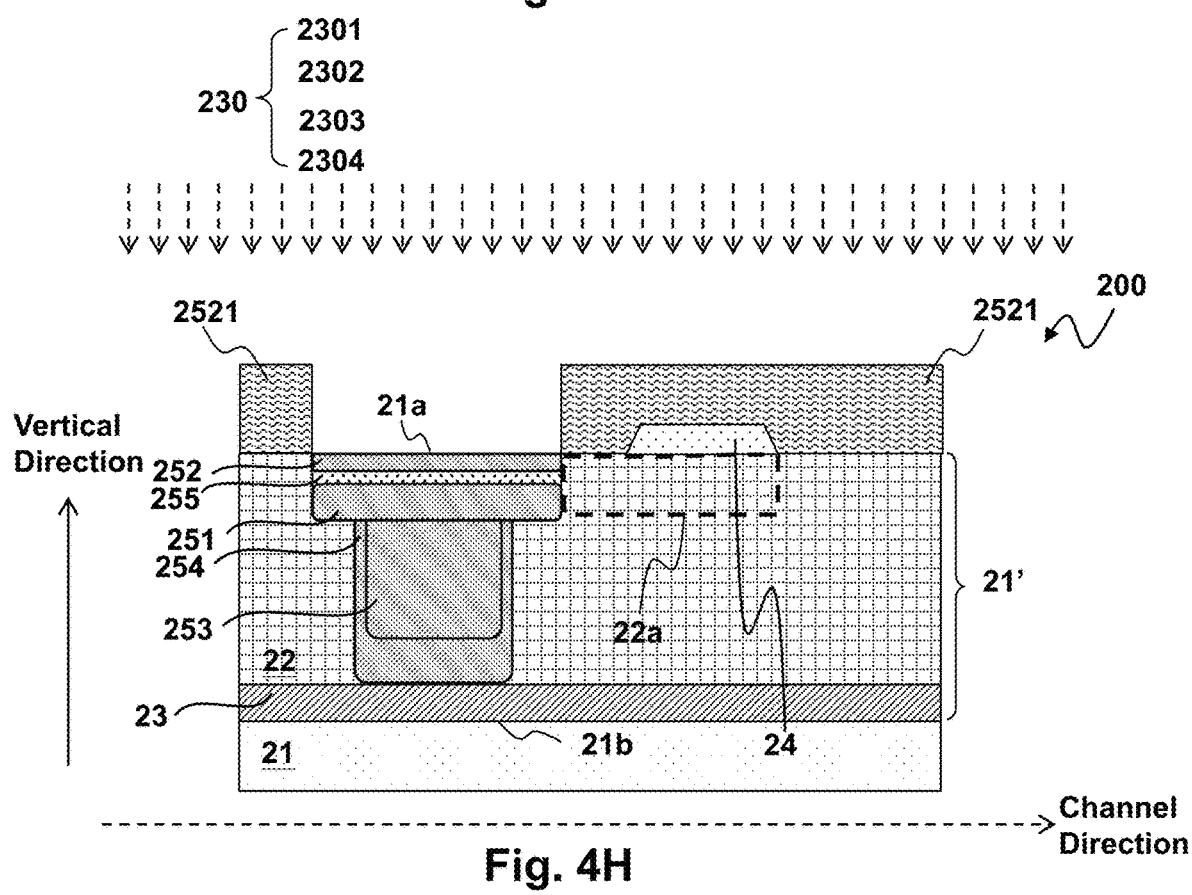

Next, referring to FIG. 4H, the second concentration peak region 252 is formed in the third layer 255. The second concentration peak region 252 of the bulk region 25 is in a top portion of the bulk region 25, and is below and in contact with the top surface 21a of the semiconductor layer 21'. The second concentration peak region 252 encompasses and is in contact with the source 28 and the source 28' (referring to FIG. 2 and FIG. 4I). The second concentration peak region 252 has the second conductivity type. The second concentration peak region 252 can be formed by, for example but not limited to, a lithography process step and an ion implantation process step, wherein the lithography process step includes: forming a photo-resist layer 2521 as a mask, and doping second conductivity type impurities in the third layer 255, to form the second concentration peak region 252. And, the ion implantation process step implants second conductivity type impurities in the third layer 255 in the form of accelerated ions as indicated by dashed arrows shown in FIG. 4H, to form the second concentration peak region 252. In one embodiment, the concentration of the second conductivity type impurities of the second concentration peak region 252 is higher than that of other regions in addition to the first concentration peak region 251 in the bulk region 25. In one embodiment, a depth of the source 28 extending downward from the top surface 21a is greater than a depth of the second concentration peak region 252 extending downward from the top surface 21a (referring to FIG. 4I).

It is worthwhile mentioning that, in one embodiment, the photo-resist layer 2511, the photo-resist layer 2521, and the photo-resist layer 2551 can be shared. That is, In one embodiment, the photo-resist layer 2551 can serve as the photo-resist layer 2511 and the photo-resist layer 2521, so as to save process steps and reduce the manufacturing cost.

Figure 4I:
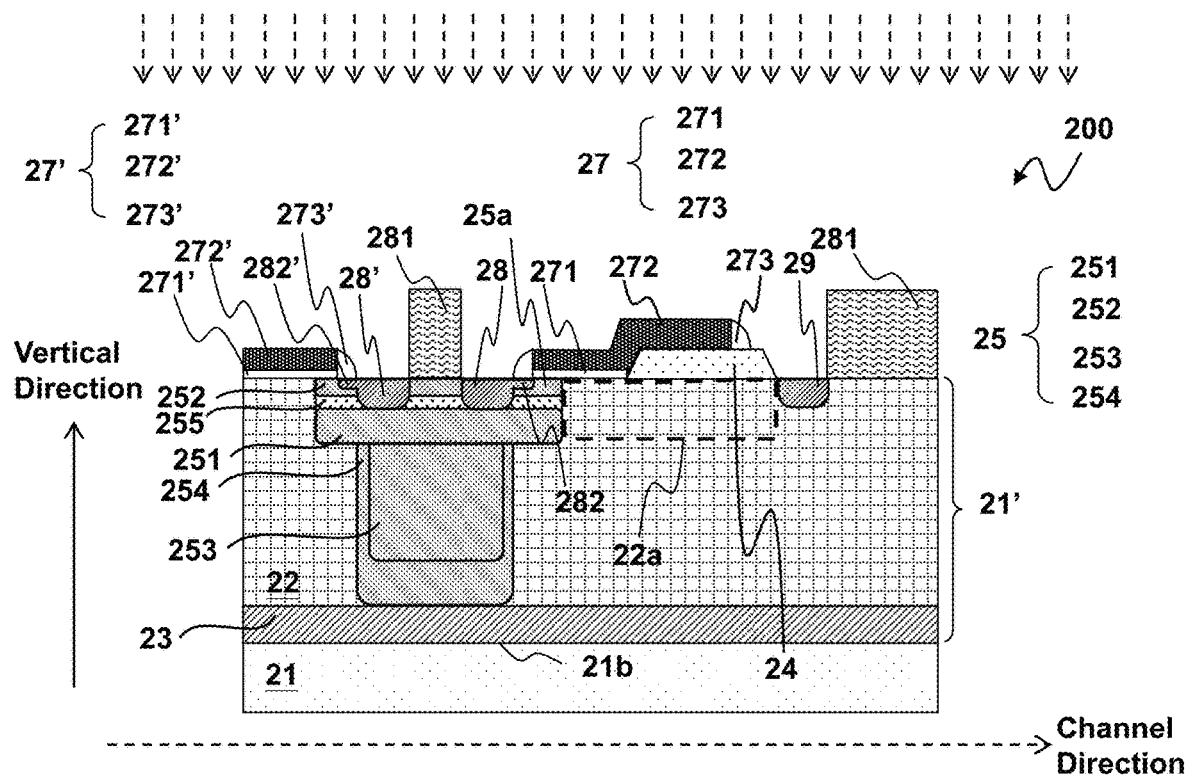

Next, referring to FIG. 4I, a dielectric layer 271 and a conductive layer 272 of the gate 27, and a dielectric layer 271' and a conductive layer 272' of the gate 27', are formed on the top surface 21a of the semiconductor layer 21'. In the vertical direction, a portion of the bulk region 25 is vertically below and in contact with the gate 27 and the gate 27', to provide an inversion current channel 25a (i.e. inversion region) of the high voltage device 200 when the high voltage device 200 is in the ON operation.

Please still refer to FIG. 4I. A lightly doped region 282 is formed after the dielectric layer 271 and the conductive layer 272 of the gate 27 are formed, wherein the lightly doped region 282 is for forming a current flowing channel right below the spacer layer 273. A lightly doped region 282' is formed after the dielectric layer 271' and the conductive layer 272' of the gate 27' are formed, wherein the lightly doped region 282 is for forming a current flowing channel right below the spacer layer 273'. The lightly doped regions 282 and 282' are provided to assist forming the inversion current channel below the spacer layer 273 and the spacer layer 273' in the ON operation of the high voltage device 200. The lightly doped region 282 and the lightly doped region 282' can be formed through, for example but not limited to, doping first conductivity type impurities in the second concentration peak region 252 of the bulk region 25, to form the lightly doped region 282 and the lightly doped region 282'. And, the ion implantation process step implants first conductivity type impurities in the second concentration peak region 252 of the bulk region 25 in the form of accelerated ions as indicated by dashed arrows shown in FIG. 4I, to form the lightly doped region 282 and the lightly doped region 282'. Because the concentrations of the first conductivity type impurities of the lightly doped region 282 and the lightly doped region 282' are far more lower than the concentrations of the first conductivity type impurities of the source 28 and the source 28' and the concentration of the second conductivity type impurities of the bulk contact 26, in the region where the lightly doped region 282 overlap with the source 28 and the bulk contact 26 and in the region where the lightly doped region 282' overlap with the source 28' and the bulk contact 26, the lightly doped region 282 and the lightly doped region 282' can be omitted. For this reason, the lightly doped region 282 and the lightly doped region 282' in the above-mentioned areas are omitted from the following figures. As shown in FIG. 4I, a spacer 273 is formed outside the sidewalls of the conductive layer 272, so as to form the gate 27. A spacer 273' is formed outside the sidewalls of the conductive layer 272', so as to form the gate 27'.

Please still refer to FIG. 4I. As shown in FIG. 4I, in the vertical direction, the sources 28 and 28' and the drain 29 are formed below and in contact with the top surface 21a of the semiconductor layer 21'. The source 28 and the drain 29 are at two different sides of the gate 27, respectively, wherein the sources 28 and 28' are in the bulk region 25 and are below and outside one side of the gate 27 in the channel direction. The drain 29 is in a part of the well 22 which is away from the bulk region 25 and is below and outside another side of the gate 27 in the channel direction. The drift region 22a lies between the drain 29 and the bulk region 25 in the channel direction (as shown by a horizontal dashed arrow in FIG. 4I), to serve as a drift current channel in the ON operation of the high voltage device 200. The sources 28 and 28' and the drain 29 have the first conductivity type. The sources 28 and 28' and the drain 29 can be formed by, for example but not limited to, a lithography process step and an ion implantation process step, wherein the lithography process step includes: forming a photo-resist layer 281 as a mask, and doping first conductivity type impurities in the bulk region 25 and the well 22, to form the sources 28 and 28' and the drain 29. And, the ion implantation process step implants first conductivity type impurities in the bulk region 25 and the well 22 in the form of accelerated ions as indicated by vertical dashed arrows shown in FIG. 4I, to form the sources 28 and 28' and the drain 29.

Figure 4J:
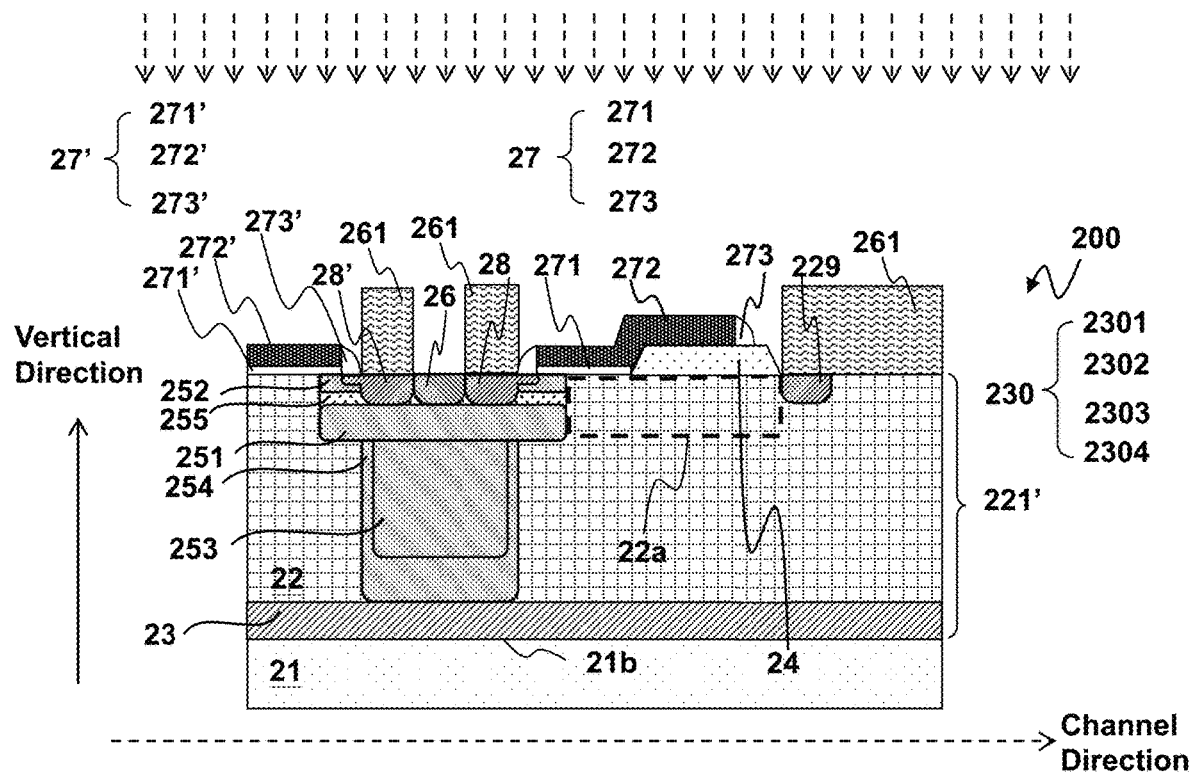

Next, referring to FIG. 4J, the bulk contact 26 is formed in the bulk region 25. The bulk contact 26 has the second conductivity type, and serves as an electrical contact of the bulk region 25. In the vertical direction, the bulk contact 26 is formed below and in contact with the top surface 21a. The bulk contact 26 can be formed by, for example but not limited to, a lithography process step and an ion implantation process step, wherein the lithography process step includes: forming a photo-resist layer 261 as a mask, and doping second conductivity type impurities in the bulk region 25, to form the bulk contact 26. And, the ion implantation process step implants second conductivity type impurities in the bulk region 25 in the form of accelerated ions as indicated by dashed arrows shown in FIG. 4J, to form the bulk contact 26. The concentration of the second conductivity type impurities of the bulk contact 26 is higher than the concentration of the second conductivity type impurities of the bulk region 25. Besides, the concentration of the second conductivity type impurities of the bulk contact 26 is lower than the concentration of the first conductivity type impurities of the source 28.

Figure 4K:
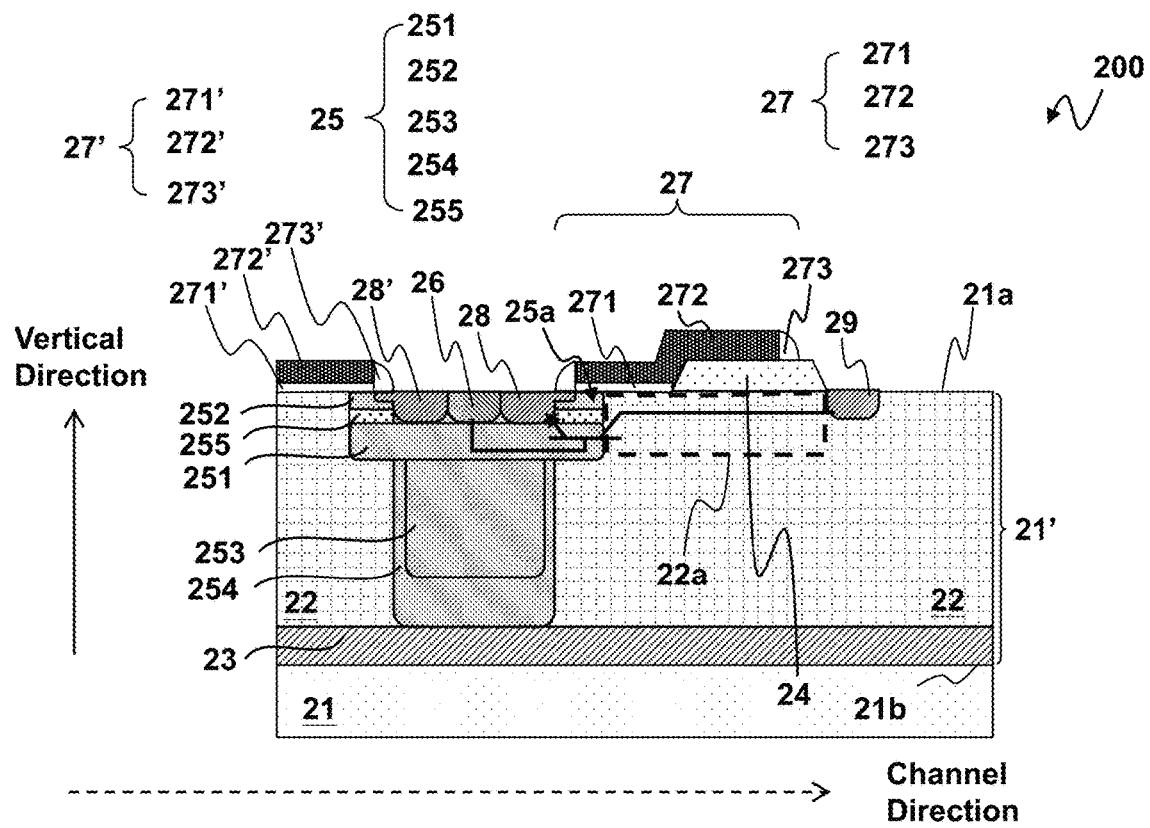

Next, as shown in FIG. 4K, the photo-resist layer 261 is removed. And, a metal silicide layer (not shown) can be formed on the bulk contact 26 and the sources 28 and 28', so as to form the high voltage device 200.

In one preferable embodiment, a low voltage device is formed on the substrate 21, and the low voltage device has a channel length of 0.18 μm. In one embodiment, a metal process step of the low voltage device is a 0.18 μm process step. That is, a minimum width size of a metal line (contact) of the low voltage device is 0.18 μm.

Figure 5A:
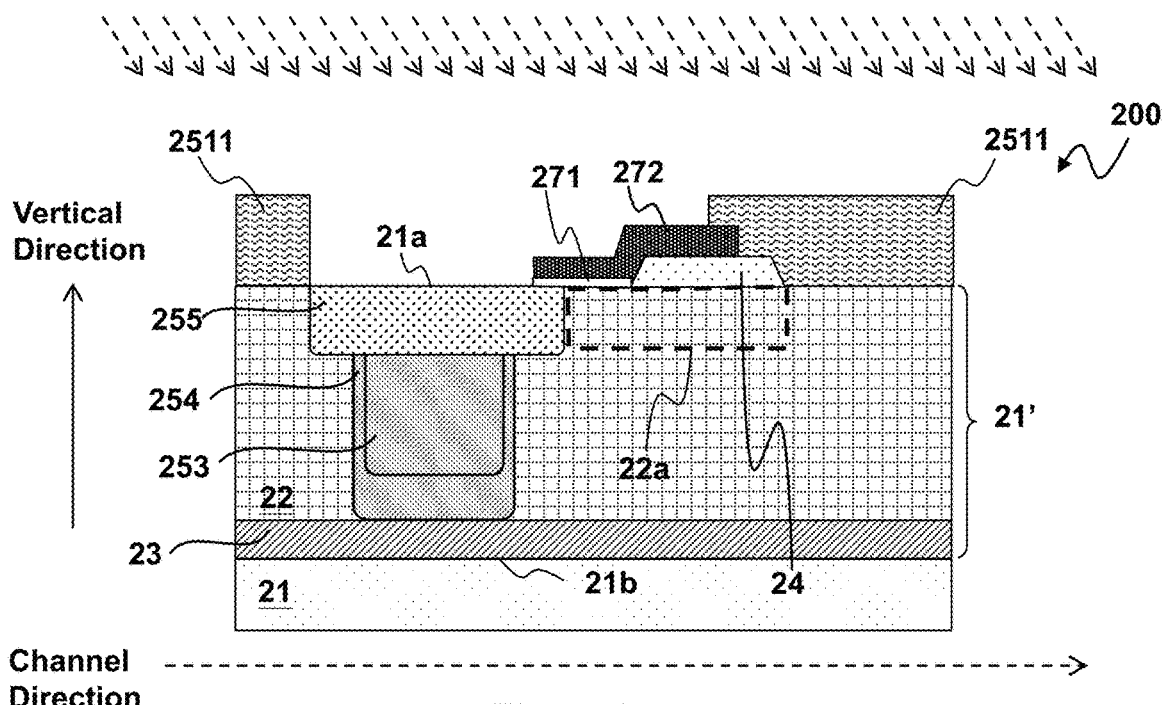
FIG. 5A-5C show steps of forming a third layer 255, a first concentration peak region, and a second concentration peak region according to an embodiment of the present invention.
Figure 5B:
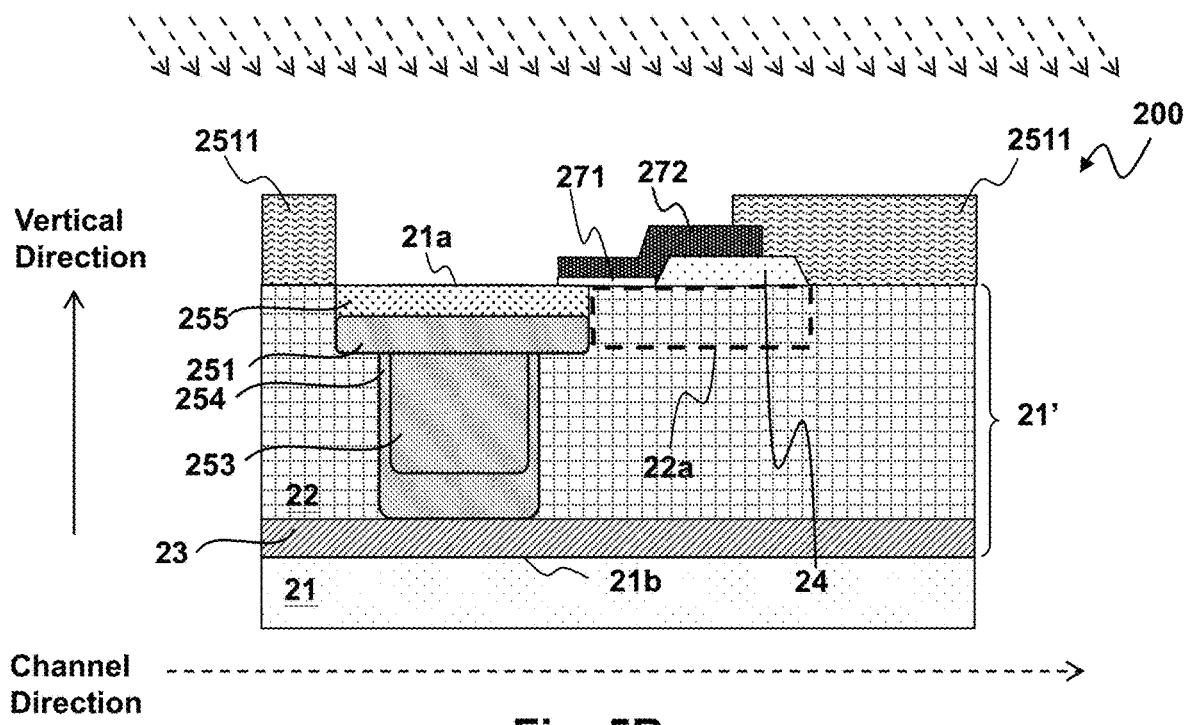
Figure 5C:
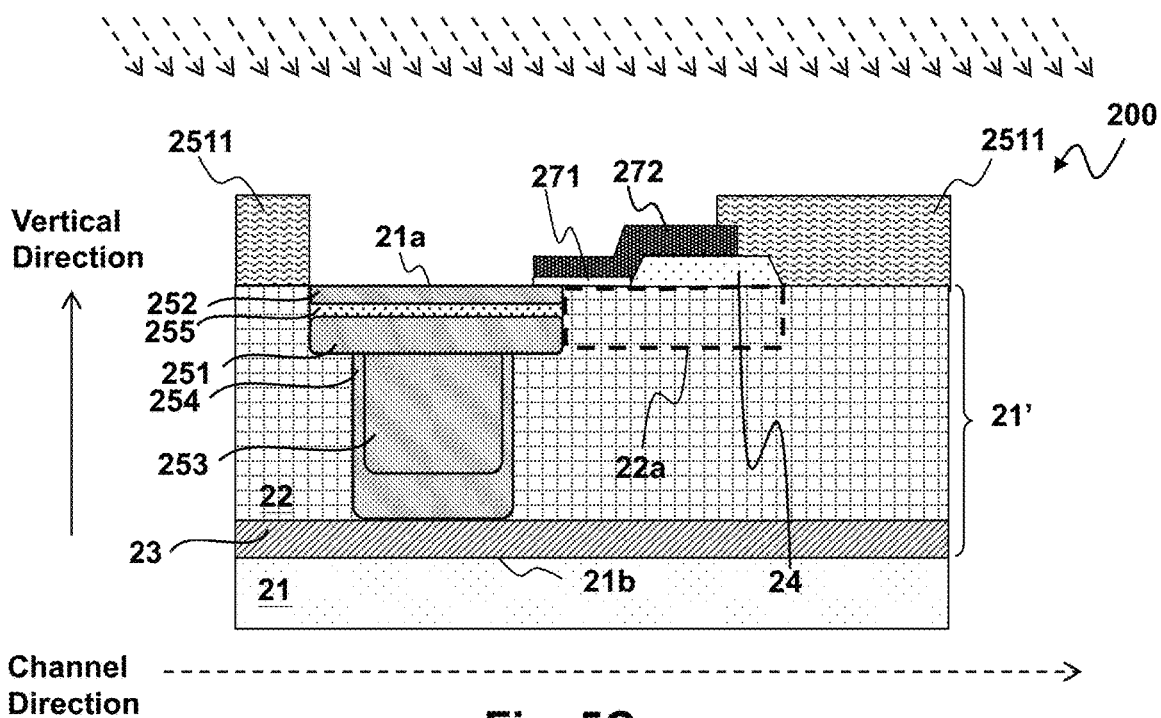

FIG. 5A-5C show steps of forming the third layer 255, the first concentration peak region 251, and the second concentration peak region 252 according to an embodiment of the present invention.

This embodiment is different from the embodiment shown in FIGS. 4A-4K in that, in this embodiment, the third layer 255, the first concentration peak region 251, and the second concentration peak region 252 are formed by a self-aligned process step, wherein the self-aligned process step includes: etching a poly silicon layer to form the conductive layer 272 of the gate 27; and using the conductive layer 272 as a mask and forming the third layer 255, the first concentration peak region 251, and the second concentration peak region 252 by an ion implantation step. The steps of this embodiment which are the same as the embodiment shown in FIGS. 4A-4K are omitted in the following description.

As shown in FIG. 5A, the dielectric layer 271 and the conductive layer 272 of the gate 27 are formed. Methods of forming the dielectric layer 271 and the conductive layer 272 for example include: etching a silicon dioxide layer and a poly silicon layer to form the dielectric layer 271 and the conductive layer 272 respectively; next, using the conductive layer 272 as a mask, or as shown in FIG. 5A, further providing the photoresist layer 2511 as the mask, the third layer 255 is formed by implanting impurities of the second conductivity type into the well region 22 in the form of accelerated ions in an ion implantation step, as indicated by the tilted dashed arrow in FIG. 5A. Note that, in order to form part of the third layer 255 below the gate 27, the incident direction of the accelerated ions needs to be tilted at a predetermined angle with respect to the normal direction of the well region 22, so that a part of the second conductivity type impurities are implanted below the gate 27.

Next, referring to FIG. 5B, the first concentration peak region 251 is formed in the third layer 255. The first concentration peak region 251 is in a bottom portion of the third layer 255, and is vertically below and in contact with the source 28 and the source 28' (referring to FIG. 2 and FIG. 4I). The first concentration peak region 251 has the second conductivity type. The first concentration peak region 251 can be formed by, for example but not limited to, using the conductive layer 272 as a mask, or as shown in FIG. 5B, further providing the photoresist layer 2511 as the mask, and doping second conductivity type impurities in the third layer 255, to form the first concentration peak region 251. And, in this embodiment, the ion implantation process step implants second conductivity type impurities in the third layer 255 in the form of accelerated ions as indicated by tilted dashed arrows shown in FIG. 5B, to form the first concentration peak region 251. In one embodiment, a concentration of the second conductivity type impurities of the first concentration peak region 251 is higher than that of other regions in the bulk region 25. Note that, in order to form part of the first concentration peak region 251 below the gate 27, the incident direction of the accelerated ions needs to be tilted at a predetermined angle with respect to the normal direction of the well region 22, so that a part of the second conductivity type impurities are implanted below the gate 27.

Next, referring to FIG. 5C, the second concentration peak region 252 is formed in the first concentration peak region 251. The second concentration peak region 252 is in a top portion of the third layer 255, and is vertically below and in contact with the top surface 21a of the semiconductor layer 21', and the second concentration peak region 252 encompasses and is in contact with the source 28 and the source 28' (referring to FIG. 2 and FIG. 4I). The second concentration peak region 252 has the second conductivity type. The second concentration peak region 252 can be formed by, for example but not limited to, using the conductive layer 272 as a mask, or as shown in FIG. 5C, further providing the photoresist layer 2511 as the mask, and doping second conductivity type impurities in the third layer 255, to form the second concentration peak region 252. And, in this embodiment, the ion implantation process step implants second conductivity type impurities in the third layer 255 in the form of accelerated ions as indicated by tilted dashed arrows shown in FIG. 5C, to form the second concentration peak region 252. In one embodiment, a concentration of the second conductivity type impurities of the second concentration peak region 252 is higher than that of other regions in addition to the first concentration peak region 251 in the bulk region 25. Note that, in order to form part of the first concentration peak region 251 below the gate 27, to form the inversion current channel 25a, the incident direction of the accelerated ions needs to be tilted at a predetermined angle with respect to the normal direction of the well region 22, so that a part of the second conductivity type impurities are implanted below the gate 27, to form the inversion current channel 25a.

The present invention has been described in considerable detail with reference to certain preferred embodiments thereof. It should be understood that the description is for illustrative purpose, not for limiting the broadest scope of the present invention. Those skilled in this art can readily conceive variations and modifications within the spirit of the present invention. The various embodiments described above are not limited to being used alone; two embodiments may be used in combination, or a part of one embodiment may be used in another embodiment. For example, other process steps or structures, such as a deep well, may be added. For another example, the lithography technique is not limited to the mask technology but it can be electron beam lithography. Therefore, in the same spirit of the present invention, those skilled in the art can think of various equivalent variations and modifications, which should fall in the scope of the claims and the equivalents.

What is claimed is:

1. A manufacturing method of a high voltage device, comprising:
    forming a semiconductor layer on a substrate;
    forming a well in the semiconductor layer, wherein the well has a first conductivity type;
    forming a bulk region in the semiconductor layer, wherein the bulk region has a second conductivity type, wherein the bulk region is in contact with the well;
    forming a gate on the semiconductor layer, wherein a portion of the bulk region is vertically below and in contact with the gate, to provide an inversion region of the high voltage device when the high voltage device is in an ON operation; and
    forming a source and a drain below a top surface of the semiconductor layer and causing the source and the drain to be in contact with the top surface of the semiconductor layer, wherein both the source and the drain have the first conductivity type, wherein the source and the drain are at two different sides of the gate, respectively, wherein the source is in the bulk region, whereas, the drain is in a part of the well which is away from the bulk region, wherein a portion of the well lies between the bulk region and the drain, to separate the bulk region from the drain;
    wherein a first concentration peak region of the bulk region is vertically below and in contact with the source, wherein the first concentration peak region completely covers a bottom of the source, so as to prevent a parasitic bipolar junction transistor to be turned on;

wherein a concentration of a second conductivity type impurities of the first concentration peak region is higher than that of other regions in the bulk region;

wherein a second concentration peak region of the bulk region is vertically below and in contact with the top surface of the semiconductor layer, wherein the second concentration peak region encompasses and is in contact with the source, and wherein the concentration of the second conductivity type impurities of the second concentration peak region is higher than that of other regions excluding the first concentration peak region in the bulk region.

2. The manufacturing method of the high voltage device of claim 1, wherein the bulk region further includes: a first layer, which is formed via a first process step, wherein at the same time, and wherein a depth of the first layer extending downward from the top surface is greater than that of the source.

3. The manufacturing method of the high voltage device of claim 2, wherein the bulk region further includes: a second layer, which is formed via a second process step, wherein at the same time, and wherein a depth of the second layer extending downward from the top surface is greater than that of the first layer.

4. The manufacturing method of the high voltage device of claim 1, further comprising:

forming a buried layer;

wherein at least a portion of the buried layer is formed in the semiconductor layer, wherein the buried layer has the first conductivity type, and wherein the buried layer is vertically below the bulk region and the well.

5. The manufacturing method of the high voltage device of claim 1, further comprising:

forming a drift oxide region on the semiconductor layer, wherein the gate is vertically above and in contact with the drift oxide region.

6. The manufacturing method of the high voltage device of claim 5, wherein the drift oxide region includes a local oxidation of silicon (LOCOS) structure, a shallow trench isolation (STI) structure, or a chemical vapor deposition (CVD) oxide structure.

7. The manufacturing method of the high voltage device of claim 1, wherein a depth of the source extending downward from the top surface is greater than that of the second concentration peak region.

8. The manufacturing method of the high voltage device of claim 1, wherein the semiconductor layer is a P-type epitaxial silicon layer with a resistance of 45 Ohm-cm.

9. The manufacturing method of the high voltage device of claim 6, wherein the drift oxide region includes the CVD oxide region with a thickness of 400 Å-450 Å.

10. The manufacturing method of the high voltage device of claim 1, wherein the high voltage device is a laterally diffused metal oxide semiconductor (LDMOS) device with a gate driving voltage of 3.3V and a gate oxide thickness of 80 Å-100 Å.

11. The manufacturing method of the high voltage device of claim 1, wherein the first concentration peak region is formed by a self-aligned process step, wherein the self-aligned process step includes: etching a poly silicon layer to form a conductive layer of the gate; and using the conductive layer as a mask and forming the first concentration peak region by an ion implantation step.

\* \* \* \* \*